US005701057A

United States Patent [19]

Gerasimov et al.

[11] Patent Number: 5,701,057

[45] Date of Patent: Dec. 23, 1997

[54] METHOD OF OBTAINING ELECTRIC DISCHARGE AND DEVICE FOR EFFECTING SAME

[75] Inventors: Jury Vasilievich Gerasimov; Jury Moiseevich Grinberg, both of Moscow; Georgy Andreevich Djuzhev, Sankt-Peterburg; Anatoly Anatolievich Kallistov, Moscow; Vladimir Iliich Kurilenko, Moscow; Vadim Izrailovich Rakhovsky, Moscow, all of U.S.S.R.

[73] Assignee: Rossisko-shveitsarskoe aktsionernoe obschestvo zakrytogo tipa "NOVA", Moscow, U.S.S.R.

[21] Appl. No.: 256,301

[22] PCT Filed: Nov. 29, 1991

[86] PCT No.: PCT/SU91/00252

§ 371 Date: Jun. 30, 1994

§ 102(e) Date: Jun. 30, 1994

[87] PCT Pub. No.: WO93/11591

PCT Pub. Date: Jun. 10, 1993

[51] Int. Cl.[6] .......... H01J 37/00

[52] U.S. Cl. .......... 315/111.21; 315/111.51; 118/723 E; 118/723 R; 156/345 P; 313/231.31

[58] Field of Search .......... 313/231.41, 231.31, 313/231.71, 358, 362.1, 148, 155; 315/111.21, 111.51; 219/121.52, 121.53; 204/298.41, 298.21, 192.12, 192.38; 118/723 E, 723 R; 156/345 P

[56] References Cited

U.S. PATENT DOCUMENTS

| | | | |
|---|---|---|---|
| 3,471,733 | 10/1969 | GE Company | 313/217 |
| 3,509,404 | 4/1970 | GE Company | 313/148 |
| 3,509,405 | 4/1970 | GE Company | 313/155 |
| 3,509,406 | 4/1970 | Rich | 313/155 |
| 4,492,845 | 1/1985 | Kijuchko et al. | 204/192.38 |
| 5,451,308 | 9/1995 | Sablev et al. | 204/298.41 |

OTHER PUBLICATIONS

J.M. Lafferty, Editor, Vacuum Arcs. Theory and Application.

*Primary Examiner*—Robert Pascal
*Assistant Examiner*—Arnold Kinkead
*Attorney, Agent, or Firm*—Collard & Roe, P.C.

[57] ABSTRACT

A method of obtaining an electric discharge effected by a device for obtaining an electric discharge resides in that on the surface of a cathode (3) is formed a layer (4) of oxides from the cathode material and together with an anode (2) made in the form of a hollow cylinder which encompasses the cathode (3) they are installed in a vacuum chamber (1). Equality of impedances is insured at each point on the surface of the anode (2) facing the cathode (3). Then an electric discharge is initiated in the gap between the anode (2) and the cathode (3). The movement and removal of the plasma-forming substance flow from the gap between the anode (2) and the cathode (3) is regulated by means of diaphragms (17, 18).

7 Claims, 2 Drawing Sheets

METHOD OF OBTAINING ELECTRIC DISCHARGE AND DEVICE FOR EFFECTING SAME

FIELD OF THE INVENTION

The present invention relates to the electrical engineering and more particularly to methods of obtaning an electric discharge and to devices for effecting the same.

PRIOR ART

At present interest has been aroused in effects of the high energy on metallic surfaces. Widely known are effects of the high energy generated by lasers. However, the use lasers is a substantially complicated problem involving the the need for the additional costly equipment.

More simple means for utilizing the high-energy effect on metallic surfaces reside in methods of obtaining an electric discharge and in devices for effecting the same.

Known in the prior art is a method of obtaining an electric discharge (J. M. Lafferty, Editor, Vacuum Arcs. Theory and Application. 1. J. D. Cobine, Introduction to Vacuum Arcs. 1.3. General Characteristics of the Vacuum Arcs. 3. G. A. Farrall, Arc Ignition Processes. 3.3. The Triggered Vacuum Arc, 1980, by John Wiley and Sons, Inc., pp. 5–8, 107–119) by way of setting up a voltage across an anode and cathode, by buiding up and maintaining around the anode and cathode a reduced pressure of gases or their mixtures corresponding to a diffusion rate of the electric discharge in the anode region, initiating and maintaining in the gap between the cathode and anode an electric discharge with cathode spots and with the formation of a plasma-forming substance from products of erosion of the cathode surface and the plasma, and an arbitrary scanning by the cathode spots of the entire surface of the cathode up to the termination of the electric discharge.

In the given method the plasma-forming substance is obtained from the products of erosion of the cathode material and the arbitrary scanning by the cathode spots is accomplished repetitively over the entire surface of the cathode up to a forced termination of the electric discharge.

Also known in the prior art is a device of obtaining an electric discharge (J. M. Lafferty, Editor, Vacuum Arcs. Theory and application. 1. J. D. Cobine, Introduction to Vacuum Arcs. 1.3. General Characteristics of the Vacuum Arcs. 3. G. A. Farrall, Arc Ignition Processes. 3.3. The Triggered Vacuum Arc, 1980, by John Wiley and Sons, Inc., pp. 5–8, 107–119), comprising a vacuum chamber accommodating an anode and cathode, main and auxiliary current leads electrically associated with the anode and cathode respectively, triggering electrodes disposed in the immediate vicinity of the cathode, a means for ordering the movement of the cathode spots affecting the gap between the anode and cathode, and a power supply source installed outside of the vacuum chamber and electrically associated with the main and auxiliary current leads, and an electric discharge triggering unit electrically associated with the triggering electrodes. In the given device the anode is substantially flat in shape and the cathode surface facing the anode is represented by the cathode material itself, and a magnetic field generator is used as a means for ordering the movement of the cathode spots.

However, in the given method and the device for effecting the same the anode construction requires an uninterrupted formation of a plasma-forming substance and a means for maintaining the electric discharge in the gap between the anode and cathode, the cathode material is used as a surface of the cathode, and the use of the magnetic field generator leads to an unsatisfactory regulation of the movement of the plasma-forming substance which involves the use of a high-current electric discharge and which in turn leads to losses of metal caused by sublimation.

Also in the given method and the device for effecting the same, a repeated and arbitrary scanning by the cathode spots of the entire surface of the cathode leads to a random thermal effect on the cathode surface which impairs the physico-chemical properties of the cathode surface.

DISCLOSURE OF THE INVENTION

The invention is essentially aimed at providing a method of obtaining an electric discharge wherein the proposed changes in operations and such additional operations will make it possible to utilize a low-current electric discharge, to order the thermal effect on the cathode surface and to provide a device for obtaining an electric discharge, comprising such an anode, cathode and a means for ordering cathode spots which will make it possible to utilize a low-current electric discharge and to order the thermal effect on the cathode surface.

This is attained by that in a method of obtaining an electric discharge by way of setting up a voltage across the anode and cathode, building up and uninterruptedly maintaining around the anode and cathode a reduced pressure of gases or their mixtures corresponding to a diffusion rate of the electric discharge in the anode region, initiating and maintaining in the gap between the cathode and anode an electric discharge with cathode spots and the formation of a plasma-forming substance from products of erosion of the cathode surface and the plasma, and an arbitrary scanning by the cathode spots of the entire surface of the cathode up to the termination of the electric discharge, according to the invention, before setting up a voltage across the anode and cathode a uniform layer of oxides of the cathode material is formed on the surface of the cathode, equality of impedances at each point of the anode surface facing the cathode is insured and when setting up the voltage across the anode and cathode a value of the voltage is selected depending upon the physico- chemical characteristics of the layer of oxides from the cathode material on the cathode surface, an electric discharge is initiated and maintained in order to obtain a flow of a plasma-forming substance from products of erosion of the layer of oxides from the cathode material on the cathode surface and simultaneously with an arbitrary scanning by the cathode spots of the movement of the scanning of the cathode surface by the cathode spots the movement of the plasma-forming substance is regulated and the plasma-forming substance is removed from the gap between the catode and anode, and the arbitrary scanning by the cathode spots is accomplished only once on the layer of oxides of the cathode material upon termination of the electric discharge after the layer of oxides of the cathode material is completely removed from the cathode surface.

It is expedient that in a method of obtaining an electric discharge before setting up the voltage across the anode and cathode an equal potential be insured at the cathode.

This is attained also by that in a device of obtaining an electric discharge and for effecting the claimed method comprising a vacuum chamber accommodating, main and auxiliary current leads electrically associated with the anode and cathode respectively, triggering electrodes disposed in the immediate vicinity of the cathode, a means for ordering the movement of cathode spots affecting the gap between the anode and cathode, a power supply source installed outside of the vacuum chamber and electrically associated with the main and auxiliary current leads, and an electric discharge triggering unit electrically associated with the triggering electrodes, according to the invention, the cathode has on the surface thereof a layer of oxides of the cathode material, and the anode is made so that it encompasses the cathode and is coaxial therewith, two diaphragms installed for directing the flow of a plasma-forming substance along the longitudinal axis of the cathode and for regulating the removal of this flow from the gap between the anode and cathode are used as a means for ordering the movement of cathode spots, and the device additionally comprises at least one more main current lead electrically associated with the power supply source and with the anode, both main current leads have equal electrical resistance and are disposed symmetric about the transverse axis of the cathode.

The device of obtaining an electric discharge and effecting the claimed method may be provided with one more auxiliary current lead electrically associated with the power supply source and the cathode, and both auxiliary current leads may advantageously have an equal electrical resistance and may suitably be disposed on the longitudinal axis of the anode.

It is desirable that in a device of obtaining an electric discharge and effecting the proposed method the anode be made in the form of a hollow cylinder and each of the diaphragms be installed at a respective end thereof.

It is likewise desirable that a device of obtaining an electric discharge and effecting the claimed method be additionally provided with flanges corresponding in number to the number of the main current leads installed on the hollow cylinder and each of which be electrically associated with a respective main current lead.

It is advantageous that in a device of obtaining an electric discharge and effecting the claimed method a part be used as a cathode.

The present invention makes it possible to utilize a low-current electric discharge which prevents losses of the cathode metal through sublimation.

In addition, the present invention provides an ordered thermal effect on the cathode surface which improves the physicochemical properties of the cathode surface.

BRIEF DESCRIPTION OF THE DRAWINGS

The present invention will now be described in greater detail with reference to specific embodiments thereof, taken in conjunction with the accompanying drawings, wherein.

BEST MODE FOR CARRYING OUT THE INVENTION

The method of obtaining an electric discharge resides in that a uniform layer of oxides of the cathode material is formed on the cathode surface and an equality of impedances is insured at each point of the anode surface facing the cathode, and a voltage is set up across the anode and cathode, with the value of voltage being selected depending upon the physicochemical characteristics of a layer of oxides of the cathode material on the cathode surface. Then, a reduced pressure of gases or their mixtures corresponding to a diffusion rate of the electric discharge in the anode region is built up and is uninterruptedly maintained around the anode and cathode, and an electric discharge is initiated and maintained in the gap between the anode and cathode for obtaining a flow of a plasma-forming substance from products of erosion of the layer of oxides of the cathode material on the cathode surface. The movement of the plasma-forming substance flow is regulated and the plasma-forming substance is simultaneously removed from the gap between the anode and cathode, and the arbitrary scanning of the layer of oxides of the cathode material is accomplished only once upon termination of the electric discharge after the layer of oxides of the cathode material is completely removed from the cathode surface.

To exclude any effect on the dynamics of movement of the cathode spots over the cathode surface, it is desirable that an equal potential be provided at the cathode before setting up a voltage across the anode and cathode.

Figure 1:
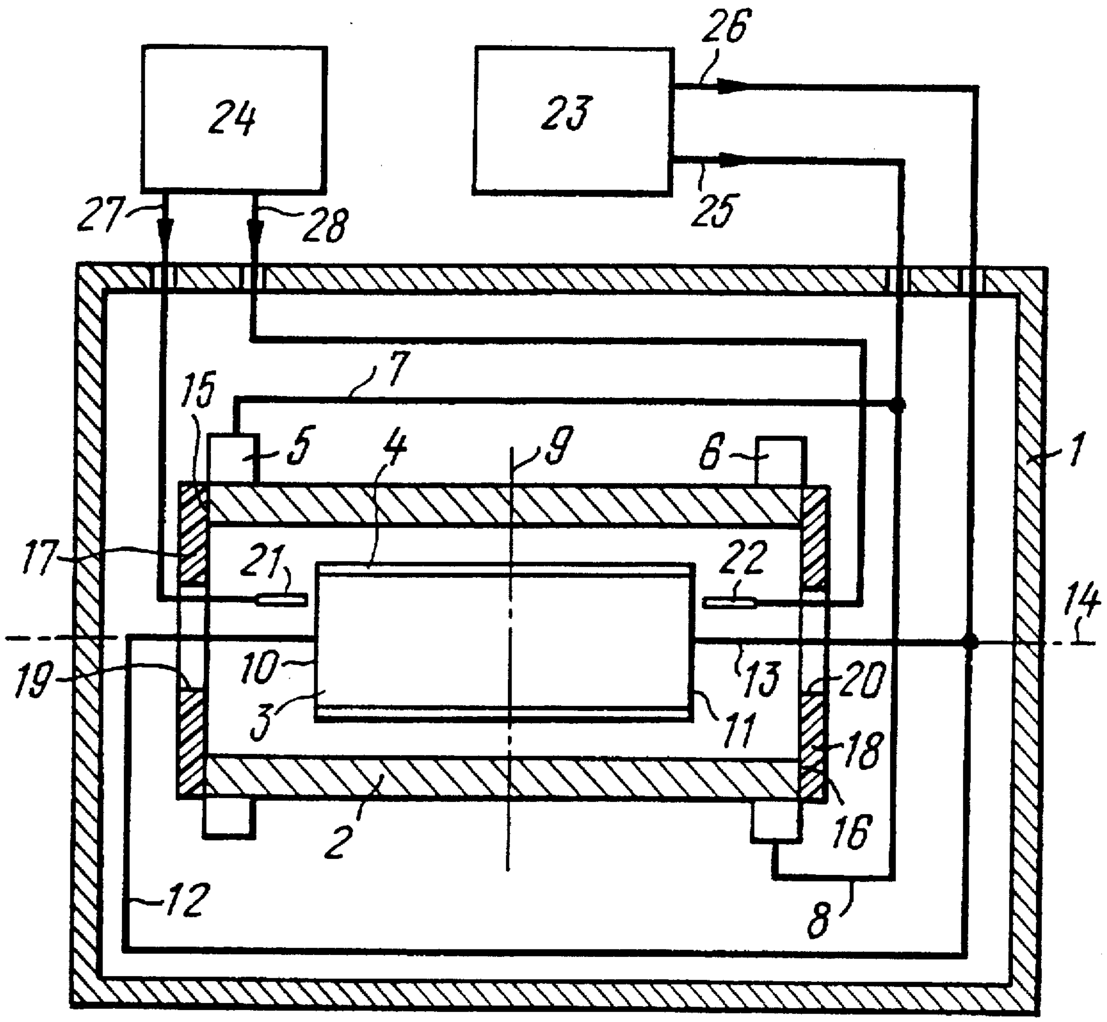
FIG. 1 is a functional diagram of a device of obtaining an electric discharge and effecting the claimed method (partly in longitudinal section), according to the invention.

A device of obtaining an electric discharge and effecting the claimed method comprises a vacuum chamber 1 (FIG. 1). The chamber 1 houses an anode 2 in the form of a hollow cylinder which internally accommodates a cathode 3 installed coaxially with the anode 2. The surface of the cathode 3 has a layer 4 of oxides of the material of the cathode 3. The anode 2 accommodates two flanges 5, 6 electrically associated with respective main current leads 7, 8. The current leads 7, 8 have equal electrical resistance and are symmetrically disposed about a transverse axis 9 of the cathode 3. Electrically connected to ends 10, 11 of the cathode 3 are respective auxiliary current leads 12, 13. The current leads 12, 13 have equal electrical resistance and are disposed on a longitudinal axis 14 of the cathode 3. Ends 15, 18 of the anode 2 carry respective diaphragms 17, 18 provided with holes 18, 20 of equal diameter. Disposed in the immediate vicinity of the ends 10,11 of the cathode 3 are triggering electrodes 21,22. A power supply source 23 and an electric discharge triggering unit 24 are arranged outside of the chamber 3. An output 25 of the power supply source 23 is electrically associated with the current leads 7,8, and an output 26 is electrically associated with the current leads 12, 13. Outputs 27, 28 of the electric discharge triggering unit 24 are electrically associated with the triggering electrodes 21,22, respectively.

Figure 2:
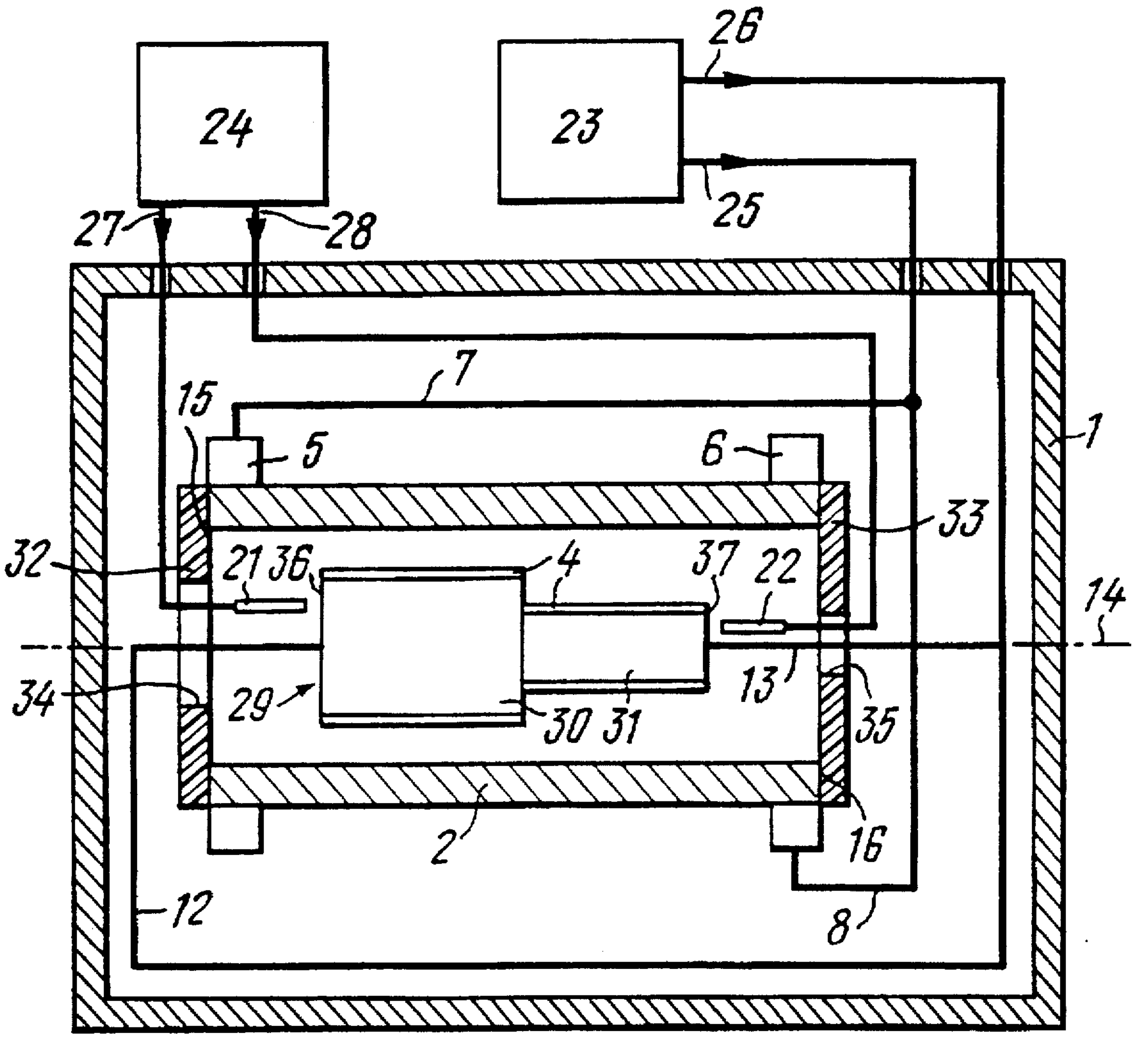
FIG. 2 is a functional diagram of a device of obtaining an electric discharge and effecting the claimed method of FIG. 1, with a part used as a cathode (partly in longitudinal section), according to the invention.

In an alternative embodiment of the invention the construction of a device of obtaining an electric discharge and effecting the claimed method is similar to that described hereinbefore. The difference resides in that a part 29 (FIG. 2) in the form of the stepped shaft 29 is used as a cathode. The shaft 29 comprises two cylinders 30, 31 coaxially disposed on the axis 14. Diaphragms 32, 33 have holes 34, 35 of different diameter. The diaphragm 32 is disposed at an end 36 of the cylinder 30 and the diaphragm 33 is disposed at an end 37 of the cylinder 31.

A device for obtaining an electric discharge and effecting the claimed method operates in the following manner.

A voltage is set up across the anode 2 and the cathode 3 by means of the power supply sourse 23 (FIG. 1) acting through the main current leads 7, 8 and the auxiliary current leads 12, 13. From the electric discharge triggering unit 24 the voltage is applied to the triggering electrodes 21, 22. As a result, an electric breakdown occurs across gaps between the electrodes 21, 22 and the respective ends 10, 11 of the cathode 3. At the moment of the breakdown both the material of the cathode 3 and the layer 4 of oxides of the material of the cathode 3 are subjected to erosion which results in the formation of a plasma-forming substance (not shown in drawing) which spreads into the gap between the anode 2 and the cathode 3, and thus contributes to the breakdown in this gap and to initiation of an electric discharge with cathode spots (not shown in drawing). The voltage across the gap of the anode 2 and the cathode 3 is selected so that the cathode spots may exist only in the presence of layer 4. Therefore, the cathode spots while moving over the layer gradually evaporate this layer and exert a momentary high-energy effect on the surface of the cathode 3 being freed from the layer 4.

Movement of the cathode spots along with the concurrent evaporation of the layer 4 and the fact that the cathode spots cannot exist in the absence of this layer 4 result in that the arbitrary scanning by the cathode spots takes place only once. The plasma-forming substance is obtained from the products of erosion of the layer 4 and this substance fills the gap the products of erosion of the layer 4 and this substance fills the gap between the anode 2 and the cathode 3.

The shape of the anode 2 in the form of a hollow cylinder encompassing the cathode 3 and the diaphragms 17,18 with the holes 19, 20 form the flow of the plasma-forming substance and provide the regulation with respect to the direction and rate of the flow removal through the holes 19, 20.

If the stepped shaft 29 (FIG. 2) is used as a cathode a device for obtaining an electric discharge and effecting the claimed method operates in the similar manner described hereinbefore. The difference resides in that due to a complicated shape of the shaft 29 (lack of symmetry, stepped shape, different geometrical dimensions along the axis 14) the regulation of the direction and rate of removal of the plasma-forming substance flow is accomplished by changing the difference in diameters of the holes 34, 38 and the diaphragms 32, 33 respectively. As to the rest, the device operates in the similar manner described hereinbefore.

The present invention may be best understood with reference to a specific embodiment thereof given hereinbelow.

The oxide layer 4 of the material of the shaft 29 (FIG. 2) was formed on the surface of the cathode made of steel in the form of the stepped shaft 29 having the diameters of 10 and 20 mm, and the length of 30 and 30 mm.

The anode 2 was made of an aluminium alloy in the form of a hollow cylinder having the length of 100 mm, the outside diameter of 70 mm and the inside diameter of 42 mm. The diaphragms 32, 33 were made in the form of dielectric washers having the thickness of 2 mm, the outside diameter of 58 mm and with the inside diameter represented respectively by the holes 34, 35 having respectively the values of diameters equal to 25 and 15 mm.

The prepared shaft 29 was installed axially inside the anode 2 and was used as a cathode. The anode 2 with the diaphragms 32, 33 and the shaft 29 and the current leads 7, 8 and 12, 13 were disposed in the chamber 1. The residual pressure in the chamber 1 was set equal to 3 Pa. A welding rectifier with drooping characteristics was used as the power supply source 23. An electric discharge was initiated on one of the ends 36, 37 of the shaft 29 by the electric discharge triggering unit 24.

Upon initiation of a discharge by the unit 24 an electric discharge occurred between the anode 2 and the shaft 29 which independently spread over the layer 4 on the surface of the shaft 29 and evaporated this layer. The discharge affected each point on the surface of the shaft 29 and spontaneously extinguished after the surface of the shaft 29 was only once arbitrarily and fully scanned by the cathode spots.

In this case the initial discharge current—95 A, the final discharge current—65 A, the initial voltage—15 V, the final voltage—17 V, the discharge time—0.5 s.

The present invention makes it possible to purposely change the physicochemical properties of the surface of parts in the fields beneficial to technological and operational applications.

In addition, the present invention provides an environmentally safe manufacturing process.

And still more the present invention makes it possible to rapidly treat the parts of different shapes intended for different applications and at low cost.

INDUSTRIAL APPLICABILITY

The present invention may be used to advantage in the metal working and electrical engineering for preparing parts for application of different coatings, removing surface streses, changing the chemical composition of a surface layer of parts and for reducing the hydrogen embrittlement in the process of electroplating.

We claim:

1. A method of obtaining an electric discharge by way of setting up a voltage in a device across an anode and a cathode comprising building up and uninterruptedly maintaining around the anode and the cathode a reduced gas pressure corresponding to a diffusion rate of a discharge in an anode region;

initiating and maintaining an electric discharge in a gap between the anode and cathode with cathode spots and a formation of a plasma forming substance from products of erosion of a surface of the cathode and the plasma, and a random scanning of the entire surface of the cathode by the cathode spots up to the termination of the electric discharge;

before setting up a voltage across the anode and the cathode forming a uniform layer of oxides of material of the cathode and insuring an equality of impedances at each point of surface of the anode facing the cathode;

when setting up the voltage across the anode and the cathode, selecting a value of the voltage depending upon physicochemical characteristics of the layer of oxides of the material of the cathode on the surface of the cathode;

initiating and maintaining an electric discharge in the gap between the anode and the cathode in order to obtain a flow of the plasma forming substance from the products of erosion of the layer of oxides of the material of the cathode on the surface of the cathode;

simultaneously with a random scanning of the cathode surface by the cathode spots regulating the movement of the flow of the plasma forming substance and removing the plasma forming substance from the gap between the anode and the cathode; and accomplishing the random scanning by the cathode spots only once on the layer of oxides of the material of the cathode upon termination of the electric discharge after the layer of oxides of the material of the cathode is completely removed from the surface of the cathode.

2. A method according to claim 1, comprising before setting up a voltage across the anode and the cathode, insuring an equal potential at the cathode.

3. A device for obtaining an electric discharge, comprising a vacuum chamber internally accommodating an anode and a cathode;

a main current lead and an auxiliary current lead electrically associated respectively with the anode and the cathode;

triggering electrodes disposed in an immediate vicinity of the cathode;

a means for ordering a movement of cathode spots affecting a gap between the anode and the cathode;

a power supply source installed outside of the vacuum chamber and electrically associated with a main current lead and an auxiliary current lead;

an electric discharge triggering unit electrically associated with the triggering electrodes;

whereby the surface of the cathode is additionally provided with a layer of oxides of cathode material and the anode is made so that it encompasses the cathode and is coaxial therewith;

two diaphragms installed for directing a flow of a plasma forming substance along a longitudinal axis of the cathode and for regulating the removal of the plasma forming substance from the gap between the anode and the cathode being used as a means for ordering the movement of the cathode spots;

at least one more main current lead electrically associated with the power supply source and with the anode; and both main current leads have equal electrical resistance and are disposed symmetrically about a transverse axis of the cathode.

4. A device according to claim 3, comprising one more auxiliary current lead electrically associated with the power supply source and the cathode; and both auxiliary current leads have equal electrical resistance and are disposed symmetrically about the longitudinal axis of the cathode.

5. A device according to claim 3, wherein the anode comprises a hollow cylinder and each of the diaphragms is respectively installed on a respective end of said hollow cylinder.

6. A device according to claim 5, comprising flanges corresponding in number to the number of the main current leads and installed on the hollow cylinder; and each of which is electrically associated with a respective main current lead.

7. A device according to claim 3, wherein the cathode comprises a stepped shaft having a first end and a second end, and wherein the first end has a diameter greater than from the diameter of the second end.

* * * * *